United States Patent [19]
Evans et al.

[11] Patent Number: 5,520,785
[45] Date of Patent: May 28, 1996

[54] METHOD FOR ENHANCING ALUMINUM NITRIDE

[75] Inventors: Keenan L. Evans, Tempe; Hang M. Liaw, Scottsdale; Jong-Kai Lin, Chandler, all of Ariz.

[73] Assignee: Motorola, Inc., Schaumburg, Ill.

[21] Appl. No.: 280,238

[22] Filed: Jul. 25, 1994

Related U.S. Application Data

[63] Continuation-in-part of Ser. No. 177,020, Jan. 4, 1994, abandoned.

[51] Int. Cl.⁶ .......................... C23C 14/34; H01L 21/324
[52] U.S. Cl. .................. 204/192.27; 204/192.18; 204/192.16; 204/192.22; 204/192.25; 437/247; 148/DIG. 3
[58] Field of Search ........................ 204/192.1, 192.15, 204/192.16, 192.17, 192.18, 192.21, 192.22, 192.25, 192.26, 192.27, 192.28; 437/247, 248; 148/DIG. 3

[56] References Cited

U.S. PATENT DOCUMENTS

| | | | |
|---|---|---|---|
| 4,058,413 | 11/1977 | Welch et al. | 437/22 |
| 4,357,180 | 11/1982 | Molnar | 437/247 |
| 4,431,460 | 2/1984 | Barson et al. | 437/247 |
| 4,502,932 | 3/1985 | Kline et al. | 204/192.18 |
| 4,728,621 | 3/1988 | Graf et al. | 437/41 |
| 4,743,569 | 5/1988 | Plumtom et al. | 437/247 |
| 4,795,717 | 1/1989 | Okamura | 437/40 |
| 5,081,067 | 1/1992 | Shimizu et al. | 437/209 |
| 5,229,358 | 7/1993 | Kumar | 505/1 |

OTHER PUBLICATIONS

Li Xinjiao et al., Thin Solid Films, "On the properties of AlN thin films grown by low temperature reactive r.f. sputtering", Jun. 2, 1986, vol. 139, pp. 261–274 (p. 268, last paragraph—p. 270, paragraph 1; FIG. 11).

Hantzpergue et al., Thin Solid Films, "Electrical properties of sputtered AlN films and interface analysis by Auger electron spectroscopy", 1981, vol. 75, pp. 167–176 (p. 168, paragraph 1; table 1).

Stanley Wolf and Richard N. Tauber, Lattice Press, Silicon Processing for the VLSI Era, vol. 1: Process Technology, Appendix 3, "Arrhenius Behavior", pp. 649–650.

*Primary Examiner*—R. Bruce Breneman
*Assistant Examiner*—Rodney G. McDonald
*Attorney, Agent, or Firm*—Aaron B. Bernstein; George C. Chen

[57] ABSTRACT

A method for enhancing aluminum nitride includes, in one version, annealing sputtered aluminum nitride in a reducing atmosphere (11), and subsequently annealing the sputtered aluminum nitride in an inert atmosphere (12). A superior aluminum nitride thin film (13) results. The films can withstand exposure to boiling water for times up to twenty minutes and maintain a refractive index, $N_f$, greater than 2.0, and a preferred crystalline orientation ratio, $I(002)/I(102)$, in excess of 1000.

18 Claims, 1 Drawing Sheet

METHOD FOR ENHANCING ALUMINUM NITRIDE

This application is a continuation-in-part of prior application Ser. No. 08/177,020, filed Jan. 4, 1994, now abandoned.

BACKGROUND OF THE INVENTION

The present invention relates, in general to a method for enhancing solid materials, and more particularly, to a novel method for enhancing aluminum nitride.

In the past sputtered aluminum nitride films have been utilized in a variety of microelectronics applications. One disadvantage of these prior films is the poor chemical stability of the as-deposited films. As-deposited, the sputtered aluminum nitride films contain a high percentage of dangling chemical bonds, are relatively porous, are less dense than epitaxially-grown single crystal aluminum nitride, and do not have a high degree of preferred crystal orientation. These physical properties make the prior films highly reactive with hot aqueous solutions and other liquid chemicals, leading to hydrolysis, oxidation or dissolution of the aluminum nitride films.

The prior as-deposited films can also readily absorb and react with trace oxygen or moisture in the processing gases at an elevated temperature. Additionally, these films may have poor preferred orientation and a high degree of crystalline defects. Aluminum nitride contaminated with trace amounts of oxygen and having poor preferred orientation can result in poor piezoelectric properties when used in acoustic wave devices.

Treatment of thin films with aqueous solutions or gas mixtures at elevated temperatures are commonly employed in the processing of semiconductor devices. Accordingly, it would be desirable to fabricate an aluminum nitride film that is chemically non-reactive with such solutions and gases.

Additionally, it would be desirable to fabricate aluminum nitride thin films which are particularly suited for piezoelectric devices such as Surface Acoustic Wave (SAW) transducers or resonators.

DETAILED DESCRIPTION OF THE DRAWINGS

Generally, in one embodiment the present invention provides a method of annealing sputter deposited aluminum nitride films which results in: superior chemical stability of the annealed films, enhancement in the preferred crystalline orientation of the annealed films, and superior piezoelectric properties for the annealed films.

Figure 1:
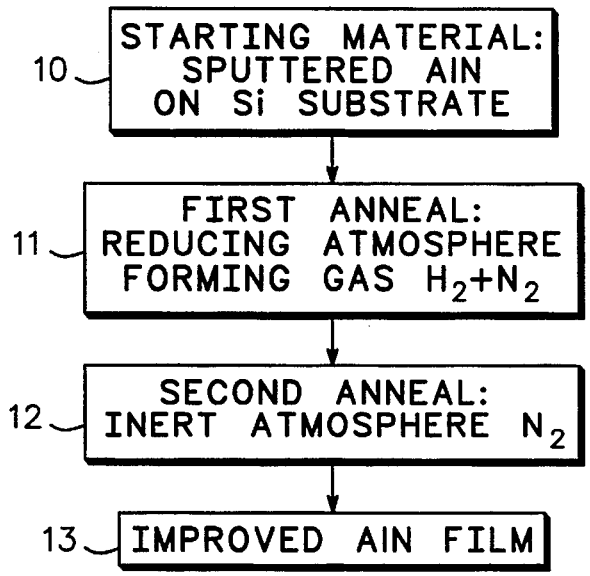
FIG. 1 is a block diagram flow chart of a two step anneal process flow in accordance with the present invention.

FIG. 1 schematically illustrates the process flow for a method of forming aluminum nitride films with superior chemical, physical and electronic properties. Box 10 indicates a sputter deposited starting material, aluminum nitride, on a suitable solid substrate. The aluminum nitride is sputter deposited onto the substrate by techniques well known to those skilled in the semiconductor art. When deposited for its piezoelectric properties, the aluminum nitride is typically reactivity sputtered 5,000 to 100,000 Å thick, with a preferred thickness of 10,000 to 20,000 Å. The substrate is commonly a single crystal silicon wafer, but can also be a variety of other semiconducting, conducting, insulating, semi-insulating materials or a combination of such materials. Examples of alternative materials include, but are not limited to silicon dioxide, gallium arsenide, silicon nitride, aluminum oxide, quartz, glass, mica, metals, metal alloys, ceramics and organic polymers.

Such an element may be utilized in a wide variety of microelectronics applications including: a) as a surface passivation layer for semiconductor devices; b) as a piezoelectric layer in surface acoustic wave (SAW) or bulk acoustic wave (BAW) devices; c) as an etch stop layer in semiconductor wafer processing; d) as a cap layer in gallium arsenide implant-activation anneal processing; e) as a gate insulating intermediate layer in metal-insulator-semiconductor (MIS) devices; f) as a thermally conductive intermediate layer in semiconductor device packaging.

Box 11 indicates a first stage anneal. This anneal is performed at high temperature in a reducing atmosphere. According to the preferred method, a forming gas atmosphere comprising 4% by volume hydrogen and 96% nitrogen is utilized. Forming gas atmospheres with compositions ranging from 1–100% by volume hydrogen with the remainder nitrogen may also be employed. The temperatures employed for the anneal of process step 11 may range from 500° C. to 1350° C., with annealing times ranging from ten hours at the lowest temperature to a few seconds at the higher temperature.

In the preferred embodiment the films are annealed at a temperature of 1000° C. for 2 hours. The annealing stage of process step 11 is commonly performed in a tube furnace such as that illustrated in FIG. 3 (discussed in more detail below), although other furnace types or annealing methods such as rapid thermal anneal (RTA) well known to those skilled in the semiconductor art, may be utilized.

Box 12 indicates the second stage anneal. This anneal chronologically follows process step 11. The second stage anneal 12 is preferably performed at high temperature in an inert atmosphere. In the preferred embodiment a pure nitrogen atmosphere is employed. Other inert atmospheres, for example argon, xenon or helium are also appropriate for this anneal stage. The temperatures employed for the anneal of process step 12 may range from 500° C. to 1350° C., with annealing times ranging from ten hours at the lowest temperature to a few seconds at the higher temperature. In the preferred embodiment the films are annealed at a temperature of 1000° C. for 2 hours.

Figure 3:
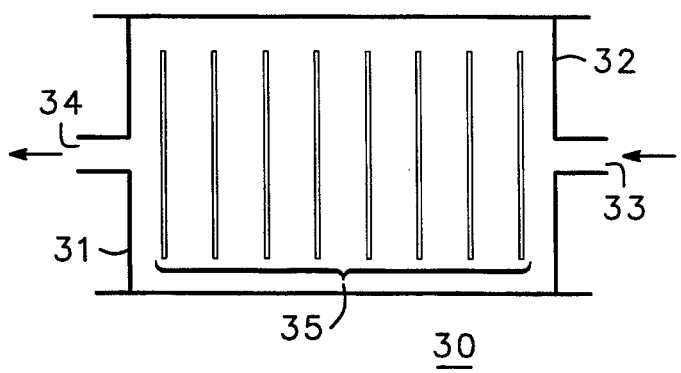
FIG. 3 is a schematic cross section view representing an annealing furnace which may be used in the process flows of FIGS. 1 and 2.

The annealing stage of process step 12 is commonly performed in a tube furnace such as that illustrated in FIG. 3, although other furnace types or annealing methods such as rapid thermal anneal (RTA) well known to those skilled in the semiconductor art, may be utilized.

Box 13 indicates the improved aluminum nitride film resulting from the annealing process described in steps 11 and 12. The improved aluminum nitride film of element 13 possesses superior chemical stability, an enhancement in preferred crystalline orientation, which results in improved piezoelectric properties.

The superior chemical stability is illustrated by a boiling water test. The chemical and physical properties of the film such as refractive index, $N_f$, of the aluminum nitride and crystal orientation are measured. The film is submersed into boiling water for times up to twenty minutes, removed from the boiling water and the chemical and physical properties of the film are remeasured. Significant decreases in $N_f$, i.e., decreases greater than 15% of the original value of 2.0, indicate that a chemical reaction and subsequent degradation of the film properties has occurred. Thus, films are sought which maintain an $N_f$ of greater than 85% the original $N_f$, after they have been submitted to the boiling water treatment.

Table I displays the refractive index of the as-deposited and annealed films before and after the boiling water treatment. Refractive index values greater than 1.9 are required for films with acceptable properties for use in the various applications stated above.

TABLE I

| Refractive Index Data | | |
|---|---|---|
| Anneal Treatment | Pre-Soak $N_f$ | Post-Soak $N_f$ |
| none | 2.07 | 1.3 |
| N2, 2 hr. | 2.00 | 1.9 |
| N2/H2 2hr. + N2 2 hr. | 2.01 | 2.01 |

X-Ray Diffraction, (XRD), studies reveal that the annealing process actually enhances the crystallinity of the as-deposited films and that this enhancement is maintained even after exposure to boiling water for as long as 20 minutes. Table II displays the XRD data acquired on the as-deposited and annealed films before and after the boiling water treatment. The (002) crystalline orientation corresponds to the primary, preferred orientation. The (102) orientation represents a minor orientation and is undesirable. Films which exhibit desired piezoelectric properties of the aluminum nitride have XRD intensity ratios for the primary to minor orientations, I(002)/I(102), in excess of 1000.

TABLE II

| | X-RAY DIFFRACTION DATA | | | |
|---|---|---|---|---|
| ANNEAL | SOAK | I(002), cts. | I(102), cts. | I(002)/I(102) |
| none | no | 90105 | 96.92 | 930 |
| none | yes | 15655 | 65.85 | 238 |
| $N_2/H_2 + N_2$ | no | 111293 | 50.77 | 2192 |
| $N_2/H_2 + N_2$ | yes | 122303 | 88.31 | 1385 |

The data illustrated in Tables I and II clearly indicate that the method of FIG. 1 produces films with superior resistance to chemical attack by aqueous solutions when compared to the as-deposited films. Furthermore, the preferred embodiment of FIG. 1 actually enhances the preferred crystal orientation of the as-deposited films and this enhancement is maintained even after exposure to boiling water for periods as long as twenty minutes.

Figure 2:
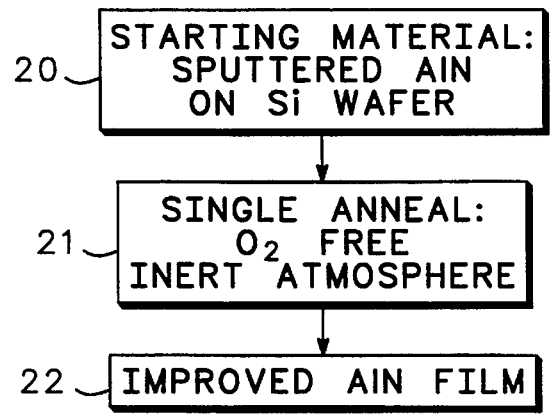
FIG. 2 is a block diagram flow chart of an alternate one step process flow in accordance with the present invention.

FIG. 2 illustrates an alternate one step embodiment of the anneal process flow. Box 20 indicates the sputter deposited starting material, aluminum nitride on a suitable solid substrate. The aluminum nitride is deposited onto the substrate by techniques well known to those skilled in the semiconductor art. The substrate is commonly a single crystal silicon wafer, but can also be a variety of other semiconducting, conducting, insulating, semi-insulating materials or their combinations. Examples of alternative materials include, but are not limited to silicon dioxide, gallium arsenide, silicon nitride, aluminum oxide, quartz, glass, mica, metals, metal alloys, ceramics and organic polymers.

Box 21 indicates the single stage anneal process step. This anneal is performed at high temperature in a inert, oxygen-free atmosphere. The atmosphere employed may be nitrogen, argon or another similar inert gas. The temperatures employed for the anneal of process step 21 may preferably range from 500° C. to 1350° C., with annealing times ranging from ten hours at the lowest temperature to a few seconds at the higher temperature. In the preferred embodiment the films are annealed at a temperature of 1000° C. for 2 hours. The annealing stage of process step 21 is commonly performed in a tube furnace such as that illustrated in FIG. 3 (discussed in more detail below), although other furnace types or annealing methods such as rapid thermal anneal (RTA) well known to those to those skilled in the semiconductor art, may be utilized.

The alternate embodiment of the invention illustrated in FIG. 2 may be useful in producing films with the desired properties only if the inert atmosphere can be made absolutely oxygen-free. Otherwise, oxygen reacting with the as-deposited aluminum nitride films at high temperatures will lead to oxidation of the film and degradation of the film's desired properties, particularly its piezoelectric property.

Box 22 of FIG. 2 indicates the improved aluminum nitride film as processed in the alternate one step anneal process. Table I displays the refractive index data of a film processed in the manner of FIG. 2 before and after the previously described boiling water treatment. This alternate one step anneal process results in a film which is clearly superior to the as-deposited film with respect to its chemical stability.

FIG. 3 is a schematic representation of a sealed furnace 30, used in the preferred embodiment of the method as described by FIG. 1 and in the alternate embodiment of the method as described by FIG. 2. Element 31 is a removable furnace cap positioned at the furnace entrance. Element 32 is a fixed furnace cap positioned at the end of the furnace. Element 33 is the gas inlet utilized for admitting the ambient annealing gases. Element 34 is the gas outlet utilized for exhausting the ambient annealing gases. Element 35 represents a removable carrier used to load the starting material indicated in boxes 10 and 21 of FIG. 1 and FIG. 2, respectively, into the sealed furnace 30. The appropriate gases are flowed through the ambient gas inlet 33 and exhausted through the gas outlet 34 to create the desired annealing atmosphere in the furnace interior.

In operation, the removable end cap 31 is removed and the starting material 10 or 21, of FIG. 1 or FIG. 2, respectively, is inserted into the furnace on the carrier 35. End cap 31 is replaced on the furnace. After the complete purging of air out of the furnace, it is elevated to a desired temperature as indicated in the descriptions of FIG. 1 and FIG. 2, and the annealing process is performed for the appropriate time. In the preferred embodiment the films are annealed at a temperature of 1000° C. for 2 hours. Upon completion of the annealing process the starting material is removed from the furnace as the improved films 13 and 22 illustrated in FIG. 1 and FIG. 2, respectively.

By now it should be appreciated that there has been discussed a novel processing method for forming sputtered aluminum nitride films which results in films with superior chemical and physical properties. The discussed embodiment of the present invention results in films which withstand exposure to boiling water for times up to twenty minutes and maintain a refractive index, $N_f$, greater than 2.0, and a preferred crystalline orientation ratio, I(002)/I(102), in excess of 1000.

We claim:

1. A method for enhancing chemical stability and crystalline and piezoelectric properties of aluminum nitride including the steps of:

sputtering an aluminum nitride layer on a surface, the aluminum nitride layer having a thickness of at least 5000 Å; and annealing the sputtered aluminum nitride to form an enhanced aluminum nitride;

wherein the enhanced aluminum nitride has a refractive index of at least 85% of a refractive index of the aluminum nitride layer.

2. The method of claim 1, wherein the step of annealing comprises annealing in a furnace.

3. The method of claim 1, wherein the step of annealing comprises rapid thermal annealing.

4. The method of claim 1, wherein the step of annealing comprises a first annealing in a reducing atmosphere.

5. The method of claim 4, wherein the reducing atmosphere comprises a forming gas including hydrogen and nitrogen.

6. The method of claim 4, wherein the first annealing takes place at a temperature in the range of 500°–1350° C.

7. The method of claim 1, wherein the step of annealing comprises annealing in an inert atmosphere.

8. The method of claim 7, wherein the inert atmosphere is substantially solely consisting of nitrogen.

9. The method of claim 1, wherein the step of annealing comprises annealing in a sealed furnace.

10. A method for enhancing chemical stability, crystalline and piezoelectric properties of sputtered aluminum nitride including the steps of:

annealing the sputtered aluminum nitride in a first ambient; and subsequently, annealing the sputtered aluminum nitride in a second ambient, wherein after annealing the sputtered aluminum nitride in the second ambient, the sputtered aluminum nitride has a refractive index of at least 85% of a refractive index of the sputtered aluminum nitride before annealing in the first ambient.

11. The method of claim 10, wherein the first ambient comprises a reducing atmosphere.

12. The method of claim 11, wherein the reducing atmosphere comprises forming gas.

13. The method of claim 12, wherein the forming gas comprises hydrogen and nitrogen.

14. The method of claim 10, wherein the second ambient comprises an inert atmosphere.

15. The method of claim 14, wherein the inert atmosphere consists substantially solely of nitrogen.

16. The method of claim 14, wherein the inert atmosphere consists substantially solely of argon.

17. The method of claim 10, further comprising the initial step of sputtering aluminum nitride on a semiconducting substrate.

18. The method of claim 10, further comprising the initial step of sputtering aluminum nitride on an insulating substrate.

\* \* \* \* \*